US010119691B2

(12) United States Patent
Dahlen

(10) Patent No.: US 10,119,691 B2
(45) Date of Patent: *Nov. 6, 2018

(54) SYSTEMS AND METHODS FOR IMPROVED LIGHTING SYSTEMS

(71) Applicant: KENALL MANUFACTURING COMPANY, Kenosha, WI (US)

(72) Inventor: Kevin Dahlen, Lindenhurst, IL (US)

(73) Assignee: KENALL MANUFACTURING COMPANY, Kenosha, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/783,803

(22) Filed: Oct. 13, 2017

(65) Prior Publication Data

US 2018/0038579 A1 Feb. 8, 2018

Related U.S. Application Data

(63) Continuation of application No. 15/357,687, filed on Nov. 21, 2016, now Pat. No. 9,816,694, which is a (Continued)

(51) Int. Cl.
*F21V 23/00* (2015.01)
*H05B 37/00* (2006.01)
(Continued)

(52) U.S. Cl.
CPC ............ *F21V 23/008* (2013.01); *F21S 2/005* (2013.01); *F21S 8/04* (2013.01); *F21V 21/005* (2013.01);
(Continued)

(58) Field of Classification Search
CPC ... H05K 7/20436; F21Y 2101/02; F21K 9/30; F21V 29/503; F21V 29/508; F21V 29/70; F21V 29/89; F21V 29/87
See application file for complete search history.

(56) References Cited

U.S. PATENT DOCUMENTS

| | | | | |
|---|---|---|---|---|
| 4,355,295 A | 10/1982 | Kent | | |
| 7,976,188 B2 * | 7/2011 | Peng | ......................... | F21S 8/04<br>362/249.02 |

(Continued)

FOREIGN PATENT DOCUMENTS

| | | |
|---|---|---|
| JP | 2011077009 A | 4/2011 |

OTHER PUBLICATIONS lutron.com, "EcoSystem® to 0-10 V Interface" (2012). Retrieved from the Internet on Mar. 14, 2014: <http://www.lutron.com/TechnicalDocumentLibrary/369357_EcoSystem_to_0-10V_Interface_Spec.pdf>.

(Continued)

*Primary Examiner* — Tung X Le
*Assistant Examiner* — Henry Luong
(74) *Attorney, Agent, or Firm* — Marshall, Gerstein & Borun LLP; Randall G. Rueth

(57) ABSTRACT

Embodiments are provided for a lighting system and a method of installing a lighting system. According to certain aspects, a driver box is configured with a plurality of drivers secured therein. A series of wired connections can couple the plurality of drivers to a plurality of luminaires and can conduct electric power from the plurality of drivers to power the plurality of luminaires. According to aspects, the driver box and its plurality of drivers are located remote from the plurality of luminaires to enable efficient maintenance of the lighting system.

20 Claims, 8 Drawing Sheets

Related U.S. Application Data continuation of application No. 14/100,859, filed on Dec. 9, 2013, now Pat. No. 9,544,973.

(51) Int. Cl.

| | |
|---|---|
| ***H05B 37/03*** | (2006.01) |
| ***F21V 29/70*** | (2015.01) |
| ***F21S 2/00*** | (2016.01) |
| ***F21S 8/04*** | (2006.01) |
| ***F21V 21/005*** | (2006.01) |
| ***F21V 23/06*** | (2006.01) |
| *F21W 111/02* | (2006.01) |
| *F21Y 115/10* | (2016.01) |

(52) U.S. Cl.

CPC ............ *F21V 23/001* (2013.01); *F21V 23/06* (2013.01); *F21V 29/70* (2015.01); *H05B 37/00* (2013.01); *H05B 37/036* (2013.01); *H05K 999/99* (2013.01); *F21W 2111/02* (2013.01); *F21Y 2115/10* (2016.08); *Y10T 29/49117* (2015.01)

(56) References Cited

U.S. PATENT DOCUMENTS

| | | | |
|---|---|---|---|
| 8,230,690 | B1 | 7/2012 | Salessi |
| 8,491,155 | B1 | 7/2013 | Cherry, II et al. |
| 9,441,815 | B2 | 9/2016 | Maxik et al. |
| 2002/0118537 | A1 | 8/2002 | Segretto |
| 2011/0219650 | A1 | 9/2011 | Wright et al. |
| 2011/0249427 | A1 | 10/2011 | Rooms et al. |
| 2012/0201024 | A1 | 8/2012 | van de Ven |
| 2013/0077311 | A1 | 3/2013 | Kinnune et al. |
| 2013/0094211 | A1 | 4/2013 | Drake et al. |
| 2014/0063776 | A1 | 3/2014 | Clark et al. |

OTHER PUBLICATIONS gelighting.com, "GE Lighting Night Vision LED solutions for efficient outdoor lighting," (2011). Retrieved from the Internet on Mar. 14, 2014: <http://www.gelighting.com/LightingWeb/br_en/images/LED_Outdoor_Luminaires_Catalogue_EN_tcm386-12804.pdf>.

bega.com, "What you need to know about our LED technology," p. 185. Retrieved from the Internet on Mar. 14, 2014: <http://bega-us.com/downloads/Catalog%20PDFs/Li-184-185.pdf>.

Phillips, TotalTunnel, Apr. 2013, entire document.

Universal Lighting Technologies, "Application Note: EVD05, LED Driver Remote Mounting", Apr. 17, 2013, entire document.

BEGA, 580 LED Remote Driver 25 Watts, BEGA-US, Mar. 2012, p. 1.

* cited by examiner

SYSTEMS AND METHODS FOR IMPROVED LIGHTING SYSTEMS

CROSS-REFERENCE TO RELATED APPLICATIONS

The present application is a continuation of U.S. patent application Ser. No. 15/357,687, filed Nov. 21, 2016, which is a continuation of U.S. patent application Ser. No. 14/100,859, now U.S. Pat. No. 9,544,973, filed Dec. 9, 2013. These disclosures are incorporated herein by reference in their entireties.

FIELD

This application generally relates to lighting systems. In particular, the application relates to platforms and techniques for leveraging multiple luminaire drivers in a single location to power a plurality of luminaires.

BACKGROUND

Most commercial buildings, parking structures, transportation areas or structures, and the like are equipped with lighting systems that typically include several luminaires or light fixtures configured to illuminate certain areas. The luminaires are powered by drivers that are physically wired to the luminaires. In typical lighting systems, the drivers are located in proximity to the luminaires that they power, in part because this arrangement simplifies the installation and wiring of the components, and also because most drivers power a single luminaire. Accordingly, typical lighting systems include a series of drivers that respectively power a series of proximal luminaires.

However, these typical lighting system installations are not ideal for some lighting applications or environments. For example, luminaires and corresponding drivers in tunnels are difficult to install, commission, and maintain. If one of the drivers malfunctions and/or needs to be replaced, a technician must locate the specific driver, access the driver, and perform the necessary maintenance or replacement. However, the driver may be difficult to access, especially if the associated luminaire is in a difficult-to-reach location. Additionally, there may be resulting inconveniences associated with driver maintenance, such as if a driver installed on a ceiling of a tunnel needs to be replaced. Therefore, the costs and difficulty of installing, commissioning, and maintaining these lighting systems are high.

Accordingly, there is an opportunity for more efficient lighting system installations and arrangements. In particular, there is an opportunity for lighting system layouts that enable efficient and effective installation, commissioning, and maintenance.

SUMMARY

In an embodiment, a lighting system is provided. In aspects, the lighting system comprises at least four drivers and a driver box adapted to removably secure the at least four drivers. The lighting system further comprises a plurality of luminaires configured to be powered by the at least four drivers via a plurality of wired connections, wherein each of the at least four drivers is configured to power at least one of the plurality of luminaires, and wherein the plurality of luminaires are located at least twenty (20) feet from the driver box.

In another embodiment, a method of installing a lighting system in a lighting environment is provided. In aspects, the method comprises installing a driver box at a location of the lighting environment that is easy to access, removably securing at least four drivers within the driver box, and installing a plurality of luminaires at a plurality of additional locations of the lighting environment that are difficult to access, wherein the location is at least twenty (20) feet from the plurality of additional locations. Further, for each of the at least four drivers, the method comprises connecting, using a wired connection, each driver to at least one of the plurality of luminaires.

In a further embodiment, a lighting system installed in a tunnel having a ground level and a ceiling is provided. According to aspects, the lighting system comprises a driver box adapted to removably secure a plurality of drivers and installed in proximity to the ground level of the tunnel. The lighting system further comprises a plurality of luminaires installed in an end-to-end arrangement and in proximity to the ceiling of the tunnel, and a set of wires adapted to conduct electric power from the set of drivers to the plurality of luminaires, wherein each of the plurality of drivers is configured to electrically power at least one of the plurality of luminaires via the set of wires.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed embodiments, and explain various principles and advantages of those embodiments.

DETAILED DESCRIPTION

The novel methods and systems disclosed herein generally relate to lighting systems and methods of installing the lighting systems. Generally, the lighting systems include a set of drivers that are configured to electrically power a corresponding set of luminaires. According to embodiments, a plurality of drivers may be included in a single "driver box" that may be installed in a particular location. Each of the plurality of drivers can be configured to electrically power one or more luminaires, where the luminaires are located remotely from the powering driver. In some cases, the luminaires of the lighting systems may be installed end-to-end or otherwise in a series such as to maximize the amount of space between driver boxes and therefore increase the ease of maintaining the driver box and the drivers within the driver box.

The methods and systems, therefore, enable a scalable solution for lighting system installations. In particular, a single driver box that houses a plurality of drivers that each supply electric power to a plurality of luminaires reduces the number of driver boxes required for the lighting system. The methods and systems, therefore, result in easier installation and maintenance efforts for the lighting system as well as reduced installation and maintenance costs. For example, if one of the drivers in a driver box malfunctions, a technician would need only access the driver box itself to diagnose which of the drivers malfunctions, and perform any necessary maintenance while accessing the driver box.

Figure 1:
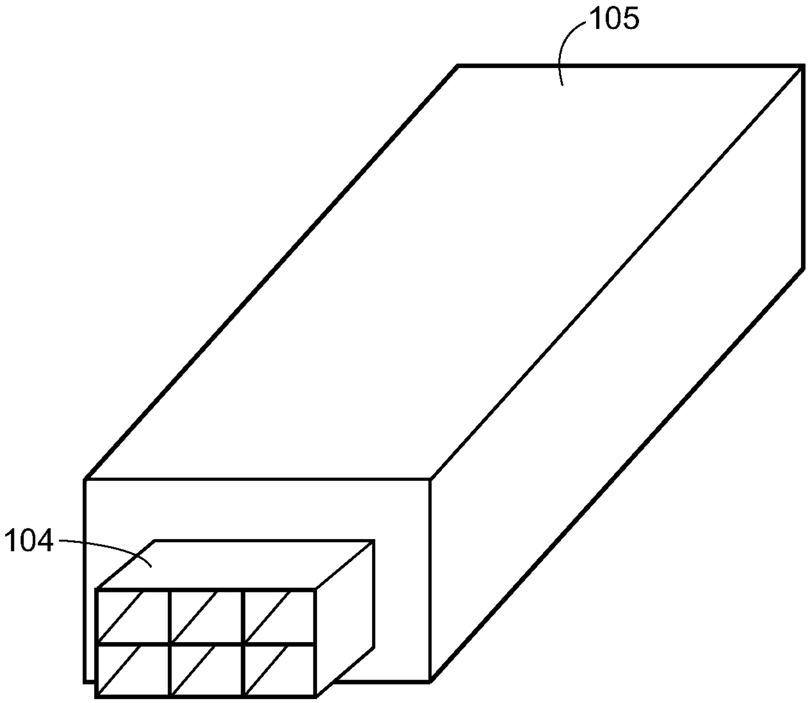
FIG. 1 is a perspective view of an example driver in accordance with some embodiments.

Referring to FIG. 1, depicted is an example driver 105 that is configured to provide or supply electric power to a set of luminaires (not shown in FIG. 1). According to some embodiments, the set of luminaires can be associated with a lighting system or a portion thereof. For example, the lighting system can be included in a parking garage (or a floor or section of the parking garage), commercial building (or a portion thereof), roadway, tunnel, or other transportation structure (or a portion thereof), residential home or building, or other indoor or outdoor space or environment. It should be appreciated that the set of luminaires can be various types such as, for example, fluorescent, incandescent, plasma, light-emitting diode (LED), or others.

The driver 105 can include various components configured to provide electric power to the set of luminaires, as understood in the art. According to some embodiments, the driver 105 can output electric power in a range of 300-500 Watts which, in some cases, is sufficient to supply adequate electric power to one or more luminaires. For example, the driver 105 is configured to supply adequate electric power to one (1) to eight (8) luminaires. As illustrated in FIG. 1, the driver 105 can include a connector 104 configured to connect the driver 105 to a conductor (e.g., a set of wires or other conductors) for conducting the electric power from the driver 105 to the luminaire(s). It should be appreciated that other electric power output ranges for the driver 105, other amounts of powered luminaires, and other configurations for connecting the driver 105 to the conductors are envisioned.

Figure 2:
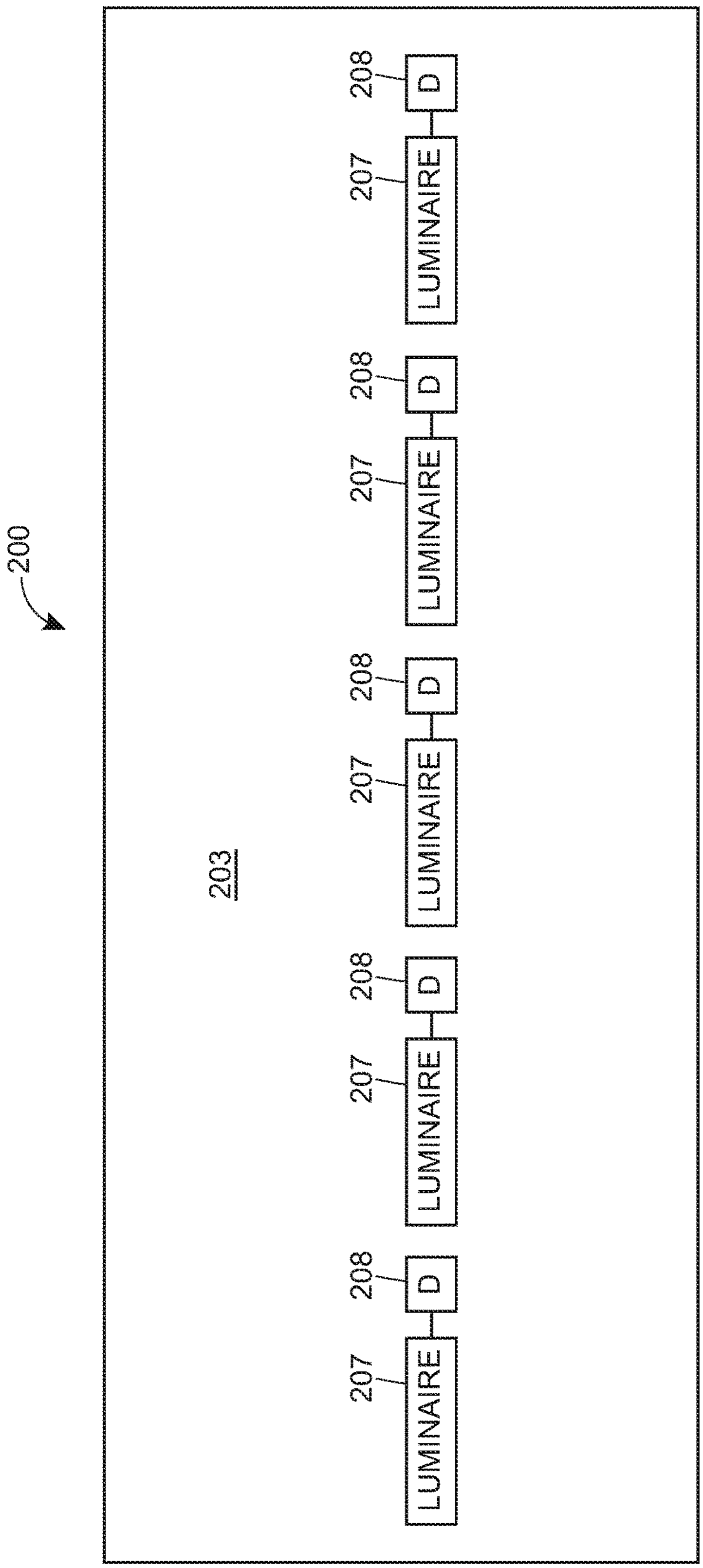
FIG. 2 Prior Art
FIG. 2 is a representation of a lighting system of some existing installations.

Referring to FIG. 2, depicted is a lighting system 200 that is included in some existing lighting applications. For purposes of explanation, it can be assumed that the lighting system 200 as illustrated in FIG. 2 is included in a tunnel 203 or other type of covered roadway through which traffic can pass. Generally, the more that vehicles reduce their speed prior to or upon entering the tunnel, the higher the risk for accidents. Accordingly, adequate and proper lighting in such tunnels is imperative to reduce lighting contrast between the outside of the tunnel and the interior of the tunnel.

As illustrated in FIG. 2, the lighting system 200 includes a series of luminaires 207 and a series of drivers 208. For example, the series of luminaires 207 may be installed on or in proximity to a ceiling of the tunnel 203 so as to supply light to the ground level of the tunnel. Each of the drivers 208 can be configured to provide power to a corresponding luminaire 207. The resulting arrangement of the lighting system 200 requires a technician to individually install each of the series of drivers 208 into a corresponding housing or fixture, and then install the housing or fixture in proximity to the corresponding luminaire 207. Additionally, if one of the series of drivers 208 malfunctions or needs maintenance, the technician must access the specific driver and perform the necessary maintenance. In the case of the tunnel 203 or similar passageway, this maintenance requires a significant amount of time due to the driver's awkward location (e.g., the ceiling of the tunnel 203) and, in some cases, the length of the tunnel 203. Additionally, the installation and maintenance of the lighting system 200 can be an inconvenience as well as a safety hazard, as the installation and maintenance may necessitate closing or reducing the amount of traffic through part or all of the tunnel 203 for a period of time.

Figure 3A:
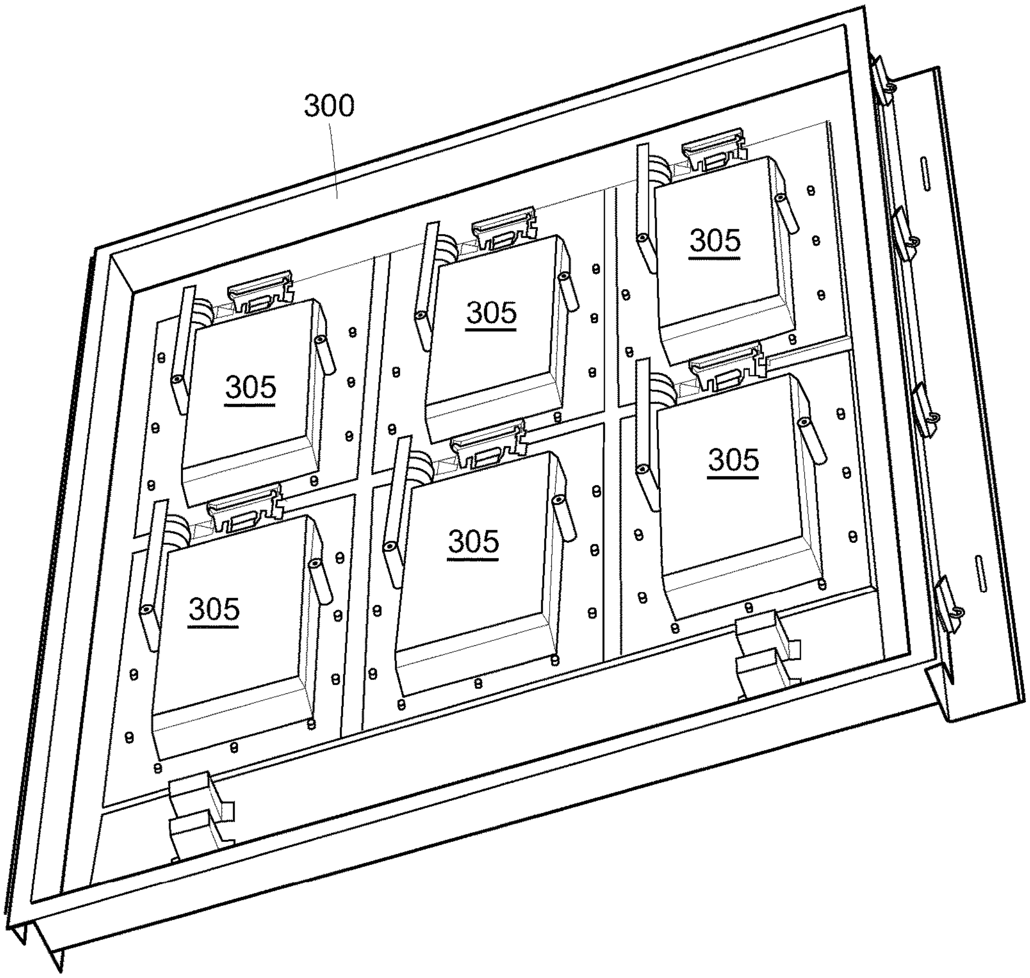
FIG. 3A is a perspective view of an example driver box housing a set of drivers, in accordance with some embodiments.
Figure 3B:
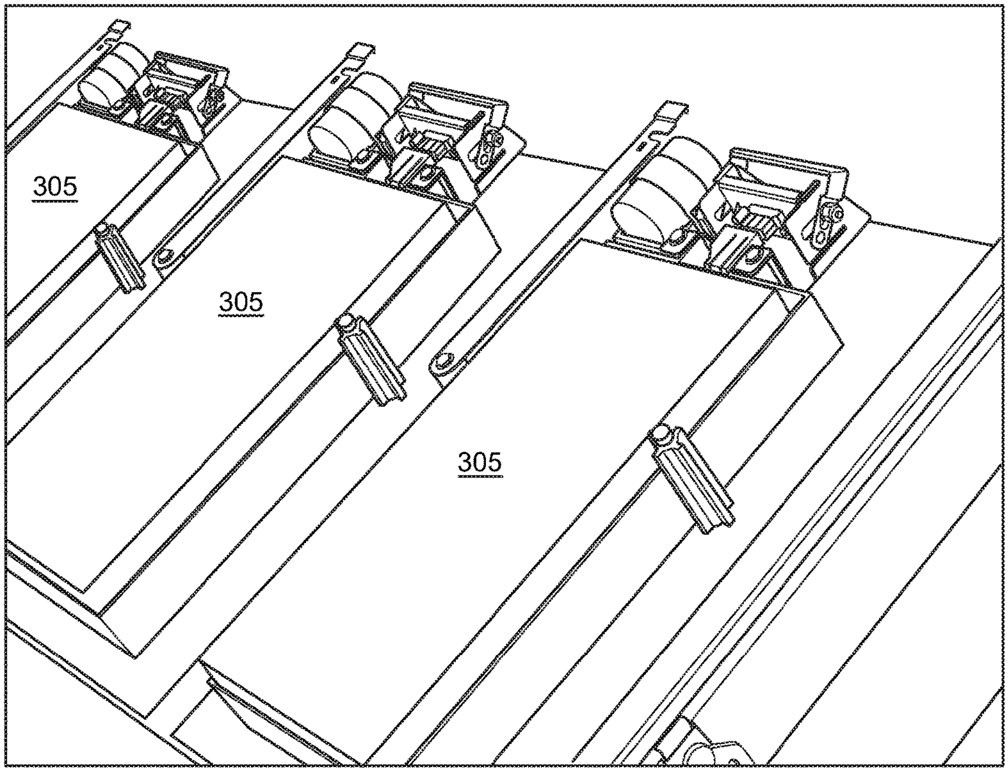
FIG. 3B is a close-up view of a set of example drivers housed in an example driver box, in accordance with some embodiments.

Referring to FIG. 3A, depicted is an example driver box 300 with a plurality of drivers 305 installed therein. Each of the plurality of drivers 305 may be removably secured in the driver box 300. In embodiments, the "quick release system" including cam locking components as described in co-owned and co-pending U.S. patent application Ser. No. 14/100,476 entitled "A Driver Box for an Improved Lighting System," the disclosure thereof hereby incorporated by reference in its entirety, may be employed to removably secure each of the plurality of drivers 305 in the driver box 300. Referring to FIG. 3B, depicted is a close-up view of some of the plurality of drivers 305 that are secured to the driver box 300 via corresponding cam lock components 308. It should be appreciated that other components and techniques may be used to secure the plurality of drivers 305 to the driver box 300.

Figure 3C:
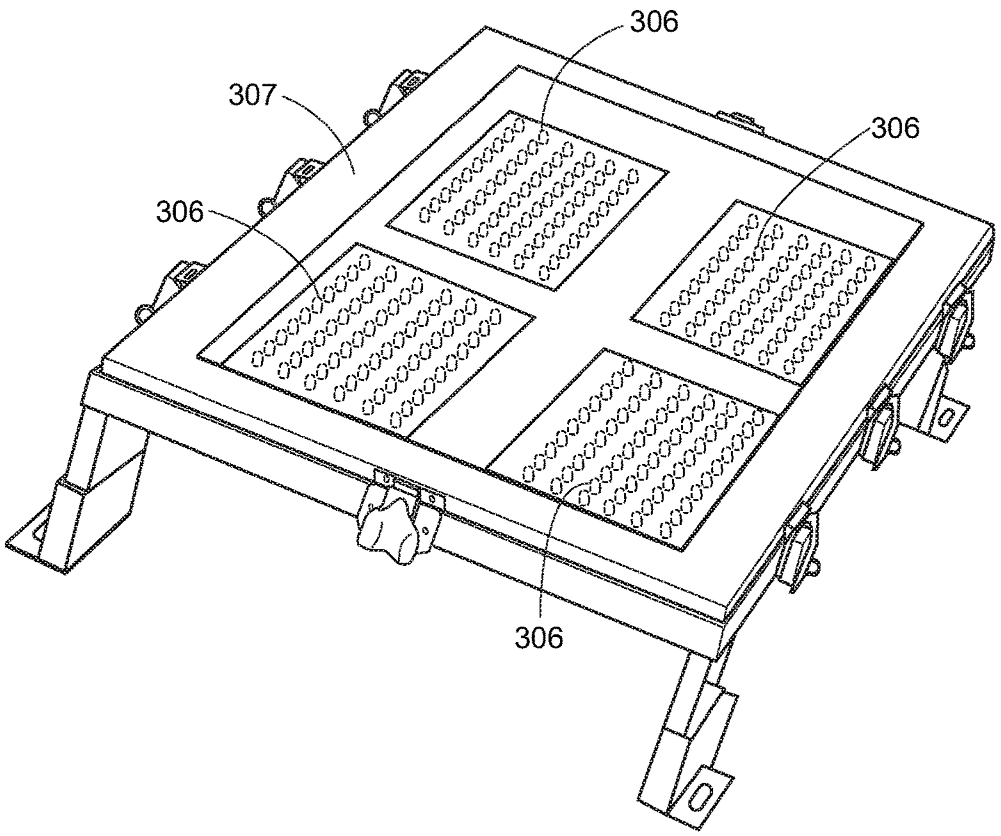
FIG. 3C is a perspective view of an example luminaire, in accordance with some embodiments.

FIG. 3C depicts an example luminaire 307 configured to be powered by one of the plurality of drivers 305. As illustrated in FIG. 3C, the luminaire 307 includes four (4) LED boards 306 each including a plurality of LEDs disposed thereon. For example, each LED board 306 can have a capacity of 48 LEDs to result in a total of 192 LEDs for the luminaire 307. It should be appreciated that other amounts of LED boards 306 (including a single LED board 306) that each include other amounts of LEDs are envisioned. Further, it should be appreciated that other types of lighting for the luminaire 307 are envisioned, such as fluorescent, incandescent, plasma, or others. Although not shown in FIG. 3C, it should be appreciated that the luminaire 307 can include one or more heat sinks for each corresponding LED board 306. For example, the bottom surface of the luminaire 307 can include a heat sink for each of the LED boards 306. In some embodiments, the heat sinks may be composed of aluminum and the luminaire 307 may be composed of stainless steel. The configuration and composition of the luminaire 307 and the heat sinks for the luminaire 307 are more fully described in co-owned and co-pending U.S. patent application Ser. Nos. 14/100,464 and 14/100,457, respectively entitled "Electronic Component for an Improved Lighting System Field" and "A Luminaire and Improved Lighting System," the disclosures thereof hereby incorporated by reference in their entireties.

Referring back to FIG. 3A, the example driver box 300 can enclose six (6) drivers 305 that can be arranged in rows and columns. It should be appreciated that the driver box 300 can enclose other amounts of drivers 305 that can be arranged in other various configurations. For example, the driver box 300 can include a range of two (2) to twelve (12) drivers 305. According to embodiments, each of the drivers 305 can be capable of supplying electric power to multiple luminaires, such as the luminaires 307. For example, each driver 305 can be configured to supply electric power to four (4) of the luminaires 307, such that a single driver box 300 that encloses six (6) drivers 305 has a capacity to supply electric power to twenty-four (24) luminaires 307. In some cases, multiple driver boxes 300 can be installed as part of a lighting system to scalably supply electric power to multiple luminaires 307. For example, a tunnel that requires hundreds of luminaires 307 for proper illumination may necessitate multiple driver boxes 300 installed in the tunnel. For further example, a floor of a large commercial building may include multiple driver boxes 300 installed at various locations to supply electric power to overhead luminaires 307.

According to embodiments, the driver box 300 can be located remotely from each of the luminaries 307 to which it (and more specifically its drivers 305) supplies electric power. Each of the drivers 305 can support a wired connection to each of the luminaires 307 to which the corresponding driver 305 supplies electric power. For example, if the lighting system is installed on one floor of a commercial building, the luminaires 307 may be appropriately installed at various locations in the ceiling of the floor and the driver box 300 may be located in a control room on that same floor or on a different floor. For further example, if the lighting system is installed in a tunnel, the luminaires 307 may be installed in an end-to-end series on the ceiling of the tunnel, and the driver box 300 may be located in a separate control room, on one of the sides of the tunnel, near a ground level of the tunnel, or in other locations.

Because the driver box 300 is located remotely from the luminaires 307, a technician can effectively and efficiently diagnose maintenance issues as well as easily perform maintenance fixes associated with the driver box 300 and/or the drivers 305 therein. For example, if one of the drivers 305 is defective, the technician is able to change out the defective driver and replace it with a functional driver by directly accessing the easily-accessible driver box 300, without having to replace a difficult-to-access driver that is proximate to the luminaires as some current lighting systems require. Further, because the connections between the drivers 305 and the driver box 300 utilize ground connections that may be "make first, break last," the technician is able to replace a driver 305 in the driver box 300 while the lighting system is powered on (i.e., while the other drivers 305 are supplying power to the luminaires 307).

Figure 4:
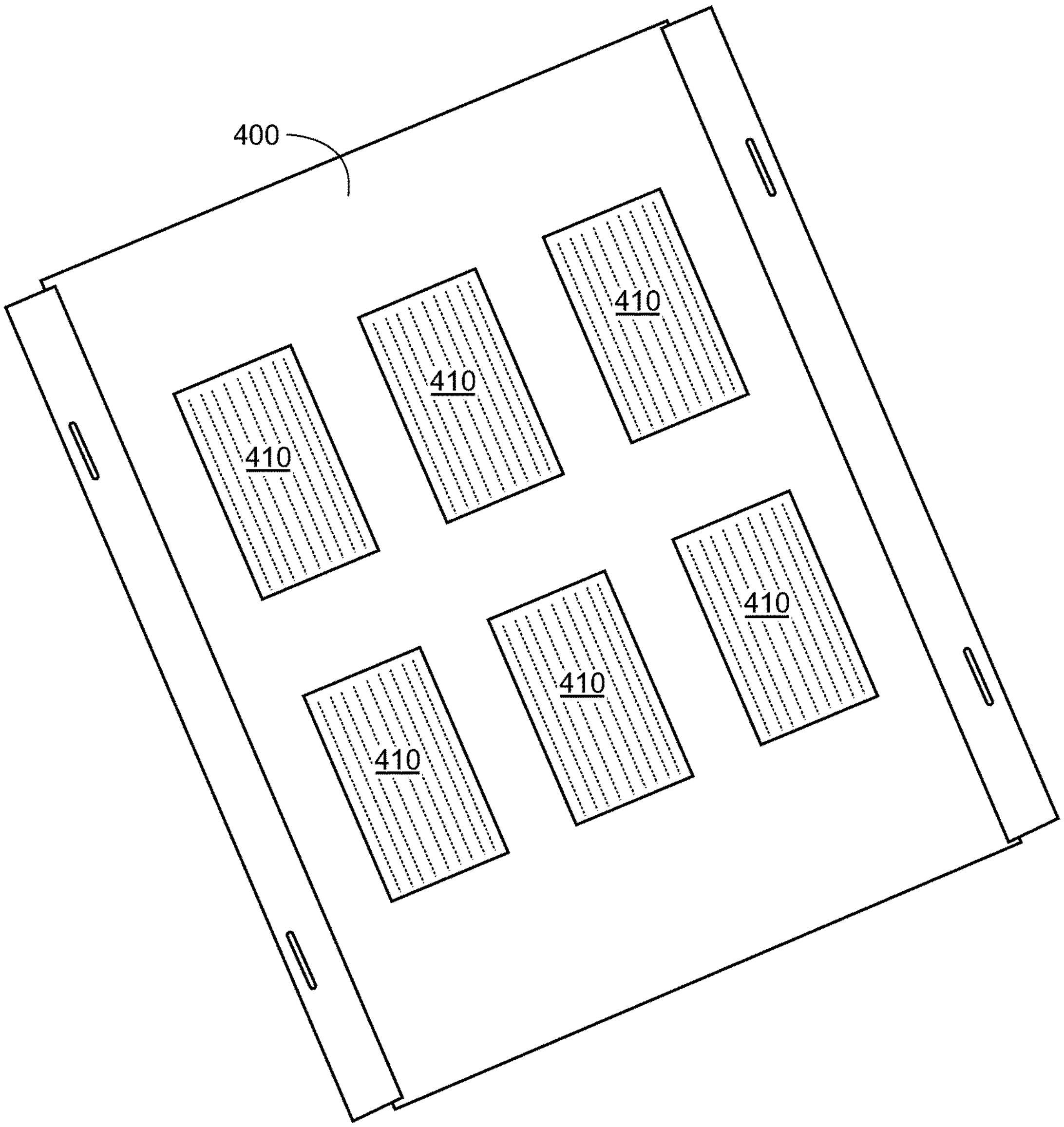
FIG. 4 is a bottom surface view of an example driver box, in accordance with some embodiments.

Referring to FIG. 4, depicted is a view of a bottom surface of an example driver box 400. The bottom surface of the driver box 400 includes individual heat sinks 410 located thereon. According to embodiments, each of the heat sinks 410 can be associated with a driver (such as one of the drivers 305) such that the heat sink 410 can be positioned to dissipate heat from the corresponding driver. In some cases, the heat sinks 410 can be formed into the bottom surface of the driver box 400, for example as a grill-like heat sink. In other cases, the heat sinks 410 may be separate components that are affixed to the bottom surface of the driver box 400. It should be appreciated that other configurations for the driver box 400 and the heat sinks 410 are envisioned.

Figure 5:
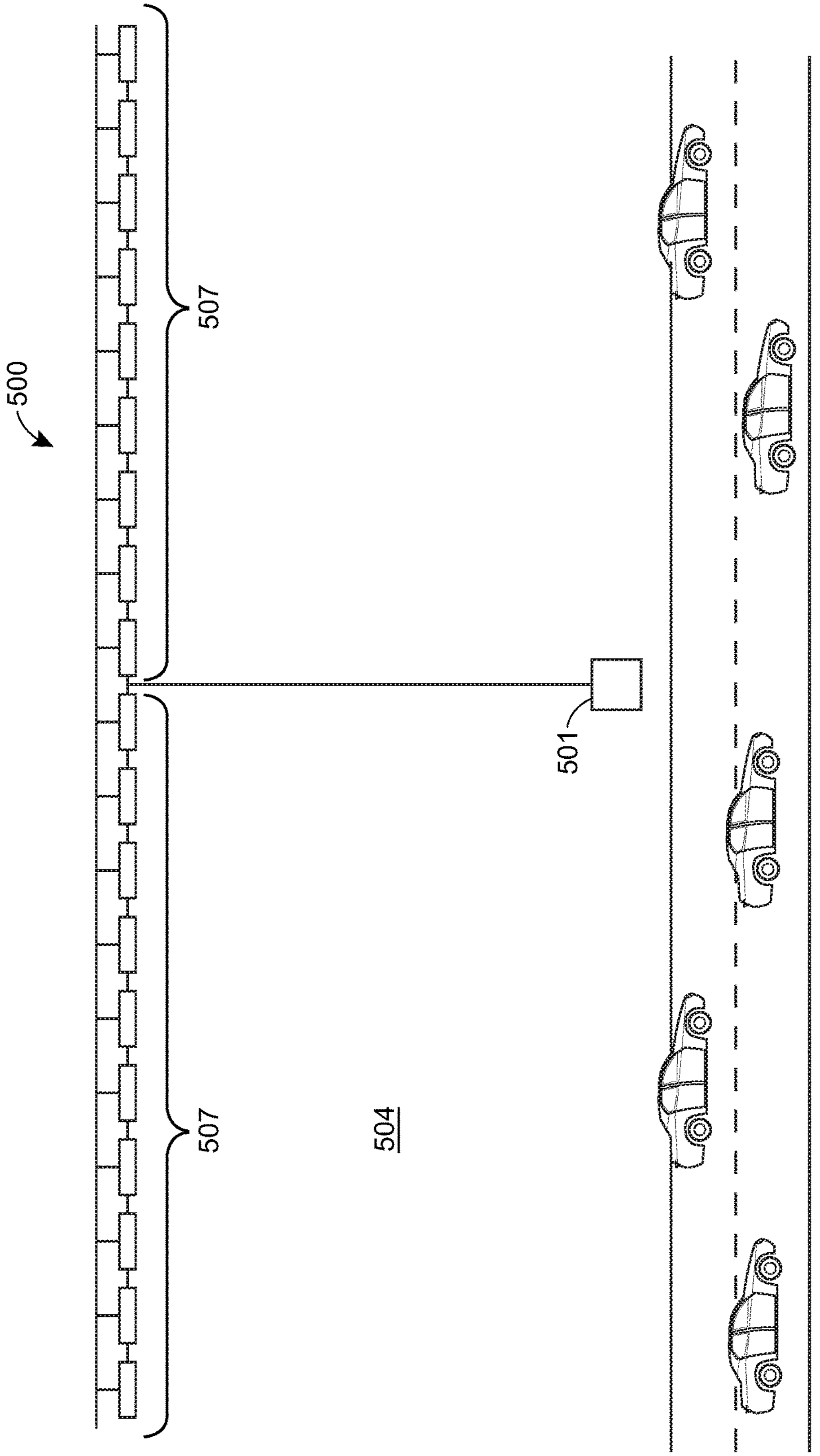
FIG. 5 depicts an example representation of a lighting system installation, in accordance with some embodiments.

Referring to FIG. 5, depicted is an example lighting system 500 that may be installed or incorporated within a structure, environment, or the like. For purposes of explanation, it may be assumed that the lighting system 500 is installed in a tunnel 504 or other type of traffic passageway. However, it should be appreciated that other environments for the lighting system 500 are envisioned. As illustrated in FIG. 5, the lighting system 500 includes a plurality of luminaires 507 installed on or near a ceiling of the tunnel 504 so as to illuminate the roadway on which vehicles pass. The lighting system 500 also includes a driver box 501 that is installed at a location of the tunnel that is remotely from the plurality of luminaires 507. For example, the driver box 501 can be located near the ground level of the tunnel at least ten (10) feet from the closest luminaire 507. It should be appreciated that the driver box 501 can be located other distances or ranges of distances from the luminaires 507, for example anywhere from five (5) feet to over seven hundred (700) feet. The driver box 501 includes a plurality of drivers (not shown in FIG. 5) that are configured to provide electric power to the plurality of luminaires 507, as discussed herein. Accordingly, the driver box 501 and the drivers thereof can form a remote, wired connection to each of the luminaires 507.

As illustrated in FIG. 5, the plurality of luminaires 507 can be installed in an end-to-end series such that the wired connection from the driver box 501 enters one end of a first luminaire 507, exits another end of the first luminaire 507, enters one end of a second luminaire 507, and so on. The end-to-end arrangement of the luminaires 507 that is powered by the single driver box 501 can occupy a large portion or length of the tunnel 504. Accordingly, the number of driver boxes 501 needed for the entire lighting system in the tunnel 504 is reduced compared to existing lighting systems. Further, the driver boxes can be spaced further apart, which reduces the access points needed for maintenance of the driver boxes and the drivers therein.

Figure 6:
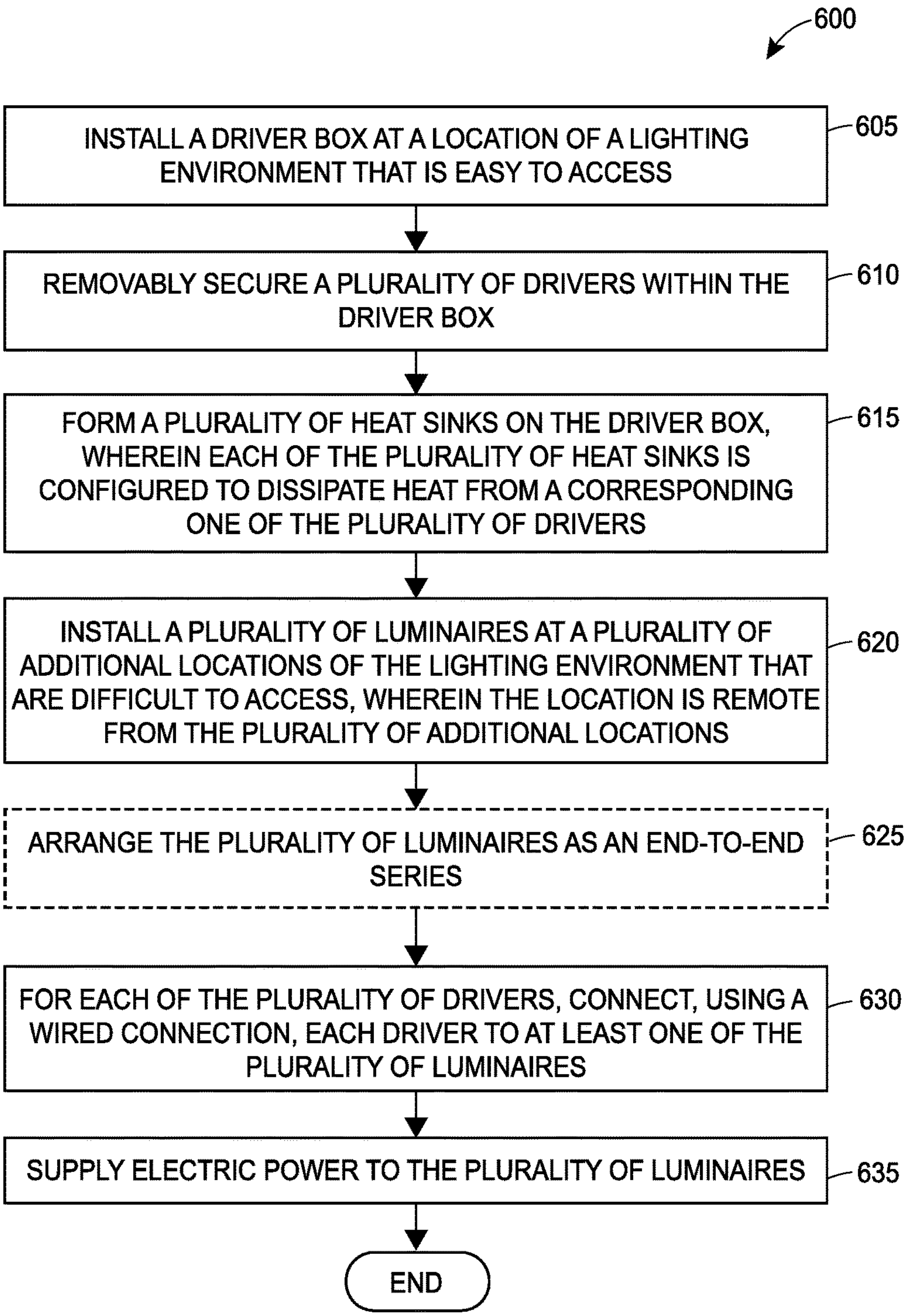
FIG. 6 is a flow diagram associated with installing a lighting system, in accordance with some embodiments.

FIG. 6 is a flowchart of a method 600 for installing a lighting system in a lighting environment. The method 600 begins with installing (block 605) a driver box at a location of the lighting environment. According to embodiments, the location may be easily accessible by an installation or maintenance technician. At block 610, a plurality of drivers are removably secured within the driver box. It should be appreciated that various amounts of drivers are envisioned and that the plurality of drivers may be disposed according to various configurations, such as via removably securing the plurality of drivers within the driver box.

At block 615, a plurality of heat sinks are formed on the driver box, wherein each of the plurality of heat sinks is configured to dissipate heat from a corresponding one of the plurality of drivers. In embodiments, the heat sinks may be formed into the bottom surface of the driver box or may be separate components affixed or secured to the bottom surface of driver box. At block 620, a plurality of luminaires are installed at a plurality of additional locations of the lighting environment, wherein the location is remotely from the plurality of additional locations. For example, the location of the driver box can be at least twenty (20) feet from the nearest additional location. Accordingly, the plurality of additionally locations may be difficult to access by an installation or maintenance technician.

At block 625, the plurality of luminaires are optionally arranged as an end-to-end series. In particular, the plurality of luminaires may be arranged in a line whereby a wired connection can pass from one of the luminaires to the next luminaire, to the next luminaire, and so on. At block 630, each of the plurality of drivers is connected to at least one of the plurality of luminaires using a wired connection. It should be appreciated that each of the plurality of drivers may be configured to power various amounts of luminaires. At block 635, electric power is supplied to the plurality of luminaires from the plurality of drivers.

Thus, it should be clear from the preceding disclosure that the systems and methods offer improved lighting systems. The embodiments advantageously enable efficient and effective maintenance of the components of the lighting systems by grouping a plurality of drivers in a single driver box so that the drivers of the driver box are able to scalably power numerous luminaires.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still cooperate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the description. This description, and the claims that follow, should be read to include one or at least one and the singular also includes the plural unless it is obvious that it is meant otherwise.

This detailed description is to be construed as examples and does not describe every possible embodiment, as describing every possible embodiment would be impractical, if not impossible. One could implement numerous alternate embodiments, using either current technology or technology developed after the filing date of this application.

The invention claimed is:

1. A lighting system, comprising:

at least two drivers;

a driver box adapted to removably secure the at least two drivers;

at least two heat sinks extending from the driver box and positioned in relation to a corresponding driver of the at least two drivers, wherein each of the at least two heat sinks is configured to dissipate heat from the corresponding driver; and a plurality of remote luminaires configured to be electrically powered by the at least two drivers via a plurality of wired connections, wherein each of the at least two drivers is configured to electrically power at least a portion of the plurality of remote luminaires.

2. The lighting system of claim 1, wherein each of the plurality of remote luminaires individually encloses multiple lighting components.

3. The lighting system of claim 2, wherein each of the at least two drivers is configured to electrically power at least a portion of the multiple lighting components of at least the portion of the plurality of remote luminaires.

4. The lighting system of claim 1, wherein the plurality of remote luminaires are located at least twenty (20) feet from the driver box.

5. The lighting system of claim 1, wherein each of the at least two drivers is configured to output electric power in a range of 300-500 Watts.

6. The lighting system of claim 1, wherein the plurality of remote luminaires are arranged in an end-to-end series.

7. The lighting system of claim 1, wherein each of the at least two drivers is configured to electrically power at least six (6) of the plurality of remote luminaires.

8. The lighting system of claim 1, wherein the at least two drivers are removably secured in the driver box via a plurality of cam locks.

9. A method of installing a lighting system in a lighting environment, the method comprising:

installing a driver box at a location of the lighting environment;

removably securing at least two drivers within the driver box;

extending at least two heat sinks from the driver box and positioned in relation to a corresponding driver of the at least two drivers, wherein each of the at least two heat sinks is configured to dissipate heat from the corresponding driver;

installing a plurality of remote luminaires at a plurality of additional locations of the lighting environment;

connecting, using a wired connection, each of the at least two drivers to at least one of the plurality of remote luminaires; and electrically powering, by said each of the at least two drivers via the wired connection using electric power, at least a portion of the plurality of remote luminaires.

10. The method of claim 9, wherein installing the plurality of remote luminaires comprises:

installing each of the plurality of luminaires to enclose multiple lighting components.

11. The method of claim 10, wherein electrically powering at least the portion of the plurality of luminaires comprises:

electrically powering, by said each of the at least two drivers via the wired connection using the electric power, at least a portion of the multiple lighting components of at least the portion of the plurality of remote luminaires.

12. The method of claim 9, wherein installing the plurality of remote luminaires comprises:

installing the plurality of remote luminaires at least twenty (20) feet from the driver box.

13. The method of claim 9, wherein electrically powering at least the portion of the plurality of luminaires comprises:

electrically powering, by said each of the at least two drivers via the wired connection using the electric power in a range of 300-500 Watts, at least the portion of the plurality of remote luminaires.

14. The method of claim 9, further comprising:

arranging the plurality of remote luminaires as an end-to-end series.

15. The method of claim 9, wherein electrically powering at least the portion of the plurality of remote luminaires comprises:

electrically powering, by said each of the at least two drivers via the wired connection using the electric power, at least six (6) of the plurality of remote luminaires.

16. A lighting system installed in a tunnel having a ground level and a ceiling, comprising:

a driver box removably securing at least two drivers, the driver box installed in proximity to the ground level of the tunnel, wherein at least two heat sinks extend from the driver box and are positioned in relation to a corresponding driver of the at least two drivers, and wherein each of the at least two heat sinks is configured to dissipate heat from the corresponding driver; and a plurality of remote luminaires installed in an end-to-end arrangement and in proximity to the ceiling of the tunnel; and a set of wires adapted to conduct electric power from the at least two drivers to the plurality of remote luminaires, wherein each of the at least two drivers is configured to electrically power at least a portion of the plurality of remote luminaires via the set of wires.

17. The lighting system of claim 16, wherein each of the plurality of remote luminaires individually encloses multiple lighting components.

18. The lighting system of claim 17, wherein each of the plurality of drivers is configured to electrically power at least a portion of the multiple lighting components of at least the portion of the plurality of remote luminaires via the set of wires.

19. The lighting system of claim 16, wherein the plurality of remote luminaires are located at least twenty (20) feet from the driver box.

20. The lighting system of claim 16, wherein each of the plurality of drivers is configured to electrically power at least the portion of the plurality of remote luminaires via the set of wires and with the electric power in a range of 300-500 Watts.

* * * * *